(12) United States Patent
Ohura et al.

(10) Patent No.: US 12,476,148 B2
(45) Date of Patent: Nov. 18, 2025

(54) METHOD OF PROCESSING WAFER

(71) Applicant: DISCO CORPORATION, Tokyo (JP)

(72) Inventors: Yukinobu Ohura, Tokyo (JP); Senichi Ryo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 492 days.

(21) Appl. No.: 18/052,327

(22) Filed: Nov. 3, 2022

(65) Prior Publication Data

US 2023/0154794 A1    May 18, 2023

(30) Foreign Application Priority Data

Nov. 15, 2021    (JP) .................................. 2021-185735

(51) Int. Cl.
  *B23K 26/359*    (2014.01)
  *B23K 26/38*    (2014.01)
  *H01L 21/768*    (2006.01)
  *H01L 21/78*    (2006.01)
  *B23K 101/40*    (2006.01)

(52) U.S. Cl.
  CPC ............ *H01L 21/78* (2013.01); *B23K 26/359* (2015.10); *B23K 26/38* (2013.01); *H01L 21/76894* (2013.01); *B23K 2101/40* (2018.08)

(58) Field of Classification Search
  CPC . H01L 21/78; H01L 21/76894; B23K 26/359; B23K 26/38; B23K 2101/40
  See application file for complete search history.

(56) References Cited

U.S. PATENT DOCUMENTS

| | | | |
|---|---|---|---|
| 2018/0197776 A1 | 7/2018 | Ban | |
| 2020/0185277 A1* | 6/2020 | Nakano | ............ H01L 21/30617 |
| 2021/0305024 A1* | 9/2021 | Tuncer | ............. H01L 21/02076 |
| 2022/0131076 A1* | 4/2022 | Chen | ...................... C23C 14/04 |

FOREIGN PATENT DOCUMENTS

| | | |
|---|---|---|
| JP | 2006140311 A | 6/2006 |
| JP | 2015090921 A | 5/2015 |
| WO | 2010038717 A1 | 4/2010 |

OTHER PUBLICATIONS

Office Action issued by the German Patent Office in corresponding German Patent Application No. 10 2022 211 755.1, dated Mar. 24, 2025.

* cited by examiner

*Primary Examiner* — Mohammad M Choudhry
(74) *Attorney, Agent, or Firm* — Greer Burns & Crain Ltd.

(57) ABSTRACT

A method of processing a wafer having a plurality of devices provided in respective areas demarcated on a face side of the wafer by a plurality of projected dicing lines. The method includes coating the face side with a protective film agent and thereafter drying the protective film agent into a protective film covering the face side, applying a laser beam having a wavelength absorbable by the wafer to the wafer along the projected dicing lines on the face side, thereby producing a plurality of laser-processed slots in the wafer, cleaning away the protective film, applying ultraviolet rays to the face side to remove an organic substance deriving from the protective film and remaining on the face side, and covering coverage areas corresponding to the respective devices on the face side with an encapsulating resin.

6 Claims, 14 Drawing Sheets

METHOD OF PROCESSING WAFER

BACKGROUND OF THE INVENTION

Field of the Invention

The present invention relates to a method of processing a wafer with a plurality of devices provided thereon and a method of manufacturing a plurality of packaged devices from such a wafer.

Description of the Related Art

Pieces of electronic equipment such as cellular phones or personal computers incorporate device chips. Device chips are manufactured as follows. First, a plurality of projected dicing lines are established in a grid pattern on a face side of a silicon wafer, hereinafter simply referred to as "wafer," and devices such as an integrated circuit (IC) are constructed in respective areas demarcated on the face side of the wafer by the projected dicing lines. Then, a laser beam applying apparatus applies a pulsed laser beam having a wavelength absorbable by the wafer to the face side of the wafer, producing laser-processed slots in the wafer along the projected dicing lines to a predetermined depth from the face side. Then, a cutting apparatus further cuts into the laser-processed slots in the wafer, dividing the wafer into device chips.

When the pulsed laser beam is applied to the wafer to produce the laser-processed slots in the wafer, a melted substance, i.e., debris, produced from the wafer by the applied pulsed laser beam is scattered around and deposited on the face side of the wafer, tending to lower quality of the device chips. To solve this problem, there has been known in the art a technology for covering the face side of the wafer with a protective film of water-soluble resin (see, for example, JP 2006-140311A). When the pulsed laser beam is applied to the face side of the wafer that is covered with the protective film, the debris produced from the wafer is deposited on the protective film. After the wafer has been processed by the pulsed laser beam, the face side of the wafer is cleaned by pure water or the like, removing the debris together with the protective film from the wafer. Accordingly, the debris is prevented from being deposited on the face side of the wafer.

SUMMARY OF THE INVENTION

However, it has been found that when the face side of the wafer is covered with an encapsulating resin after the protective film and the debris have been removed, there are instances where the face side of the wafer and the encapsulating resin are not held together in a sufficient level of intimate contact with each other.

The present invention has been made in view of the above difficulty. It is an object of the present invention to increase the level of intimate contact between the face side of a wafer and an encapsulating resin covering the face side of the wafer.

In accordance with an aspect of the present invention, there is provided a method of processing a wafer having a plurality of devices provided in respective areas demarcated on a face side of the wafer by a plurality of intersecting projected dicing lines established on the face side. The method includes a protective film applying step of coating the face side of the wafer with a protective film agent and thereafter drying the protective film agent into a protective film covering the face side of the wafer, after the protective film applying step, a laser processing step of applying a laser beam having a wavelength absorbable by the wafer to the wafer along the projected dicing lines on the face side of the wafer, thereby producing a plurality of laser-processed slots in the wafer along the projected dicing lines, after the laser processing step, a protective film removing step of cleaning away the protective film, after the protective film removing step, a residual organic substance removing step of applying ultraviolet rays to the face side of the wafer to remove an organic substance deriving from the protective film and remaining on the face side of the wafer, and after the residual organic substance removing step, an encapsulating resin applying step of covering coverage areas corresponding to the respective devices on the face side of the wafer with an encapsulating resin.

The organic substance remaining on the face side of the wafer after the protective film removing step and before the residual organic substance removing step includes compounds containing nitrogen atoms.

In accordance with another aspect of the present invention, there is provided a method of manufacturing a plurality of packaged devices from a wafer having a plurality of devices provided in respective areas demarcated on a face side of the wafer by a plurality of intersecting projected dicing lines established on the face side. The method includes a protective film applying step of coating the face side of the wafer with a protective film agent and thereafter drying the protective film agent into a protective film covering the face side of the wafer, after the protective film applying step, a laser processing step of applying a laser beam having a wavelength absorbable by the wafer to the wafer along the projected dicing lines on the face side of the wafer, thereby producing a plurality of laser-processed slots in the wafer along the projected dicing lines, after the laser processing step, a protective film removing step of cleaning away the protective film, after the protective film removing step, a residual organic substance removing step of applying ultraviolet rays to the face side of the wafer to remove an organic substance deriving from the protective film and remaining on the face side of the wafer, and after the residual organic substance removing step, a packaged device producing step of producing a plurality of packaged devices in which coverage areas corresponding to the respective devices on the face side of the wafer are covered with an encapsulating resin.

The method of processing a wafer according to the aspect of the present invention includes, after the protective film removing step, the residual organic substance removing step of applying ultraviolet rays to the face side of the wafer to remove an organic substance deriving from the protective film and remaining on the face side of the wafer. Since the organic substance deriving from the protective film is removed in the residual organic substance removing step, the amount of organic substance remaining on the face side is reduced to about the same level as if the face side were not covered with the protective film. Therefore, the level of intimate contact between the face side of the wafer and the encapsulating resin becomes higher than if the residual organic substance removing step were not carried out.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
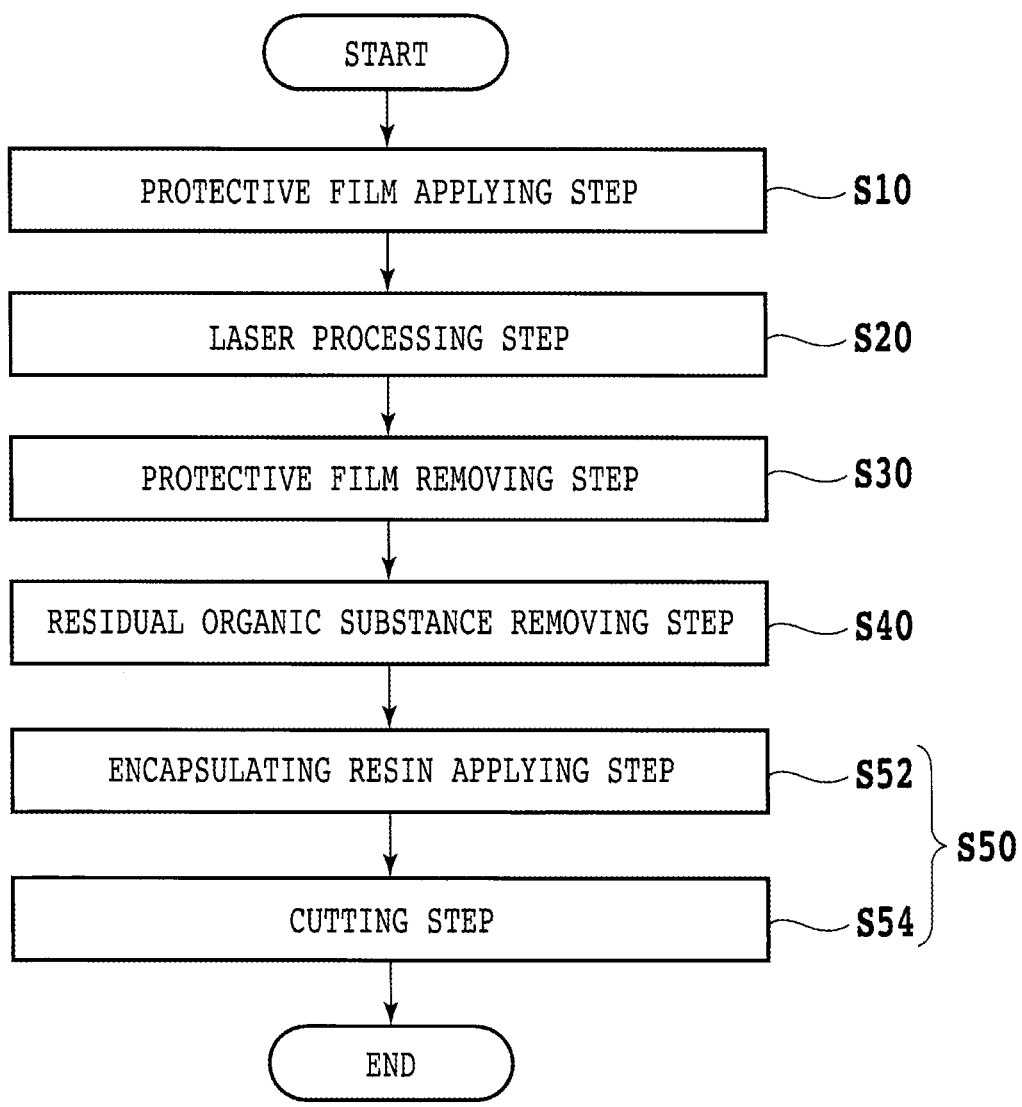
FIG. 1 is a flowchart of a sequence of a method of manufacturing a plurality of packaged devices according to a first embodiment of the present invention.

Preferred embodiments of the present invention will be described below with reference to the accompanying drawings. FIG. 1 illustrates a sequence of a method of manufacturing a plurality of packaged devices 31 (see FIG. 12) according to a first embodiment of the present invention. As illustrated in FIG. 1, the method of manufacturing a plurality of packaged devices 31 includes a protective film applying step S10, a laser processing step S20, a protective film removing step S30, a residual organic substance removing step S40, an encapsulating resin applying step S52, and a cutting step S54. In the present description, some of the steps of the method of manufacturing a plurality of packaged devices 31 may be referred to as a method of processing a wafer 11. According to the first embodiment, the encapsulating resin applying step S52 and the cutting step S54 will collectively be referred to as a packaged device producing step S50. Each of the packaged devices 31 manufactured according to the first embodiment is also called "wafer level chip size (scale) package (WL-CSP)". The steps of the method illustrated in FIG. 1 will be described below.

Figure 2:
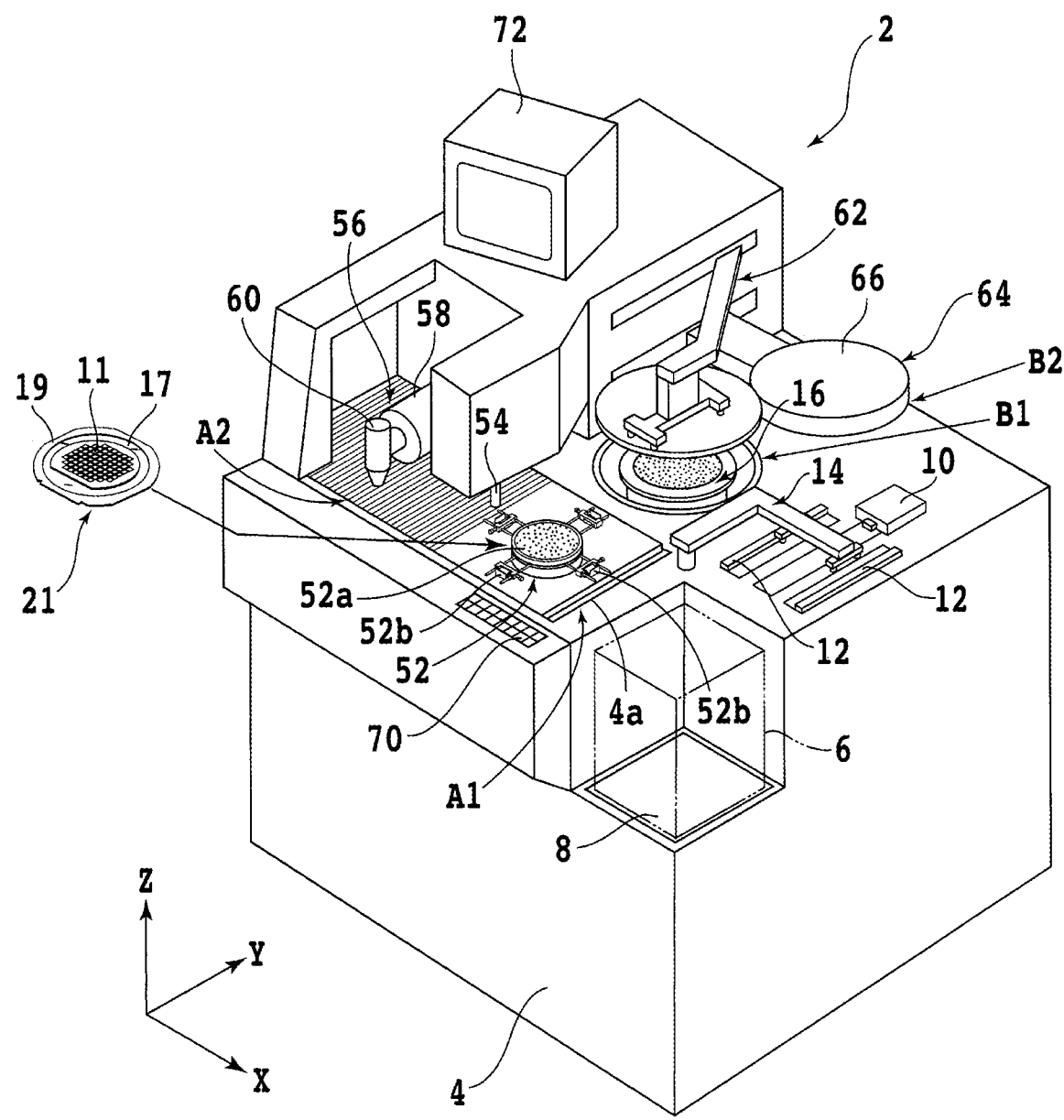
FIG. 2 is a perspective view of a laser processing apparatus.

FIG. 2 illustrates, in perspective, a laser processing apparatus 2 to be used in each of protective film applying step S10, laser processing step S20, protective film removing step S30, and residual organic substance removing step S40. In FIG. 2, the laser processing apparatus 2 is illustrated in reference to a three-dimensional coordinate system having X-, Y-, and Z-axes indicated respectively by the arrows X, Y, Z, where X-, Y-, and Z-axes are orthogonal with each other. The X-axis and the Y-axis lie on a horizontal plane, whereas the Z-axis extends vertically perpendicularly to the horizontal plane. X-axis directions, i.e., leftward and rightward directions, extend parallel to the X-axis, and Y-axis directions, i.e., forward and rearward directions, extend parallel to the Y-axis. Z-axis directions, i.e., upward and downward directions, extend parallel to the Z-axis perpendicularly to the X-axis and the Y-axis. The laser processing apparatus 2 has a base 4 supporting thereon and housing therein the components of the laser processing apparatus 2. The laser processing apparatus 2 includes a cassette table 8 shaped as a rectangular plate for supporting a cassette 6 thereon. The cassette table 8 is disposed in a front corner of the base 4 that is oriented in one of the Y-axis directions and one of the X-axis directions. An elevator, not depicted, is disposed in the base 4 beneath the cassette table 8 for selectively lifting and lowering the cassette table 8 along the Z-axis. The cassette 6 houses therein a plurality of wafer units 21 each having a wafer 11 shaped as a circular plate having a substrate mainly made of a semiconductor material such as silicon.

Figure 3:
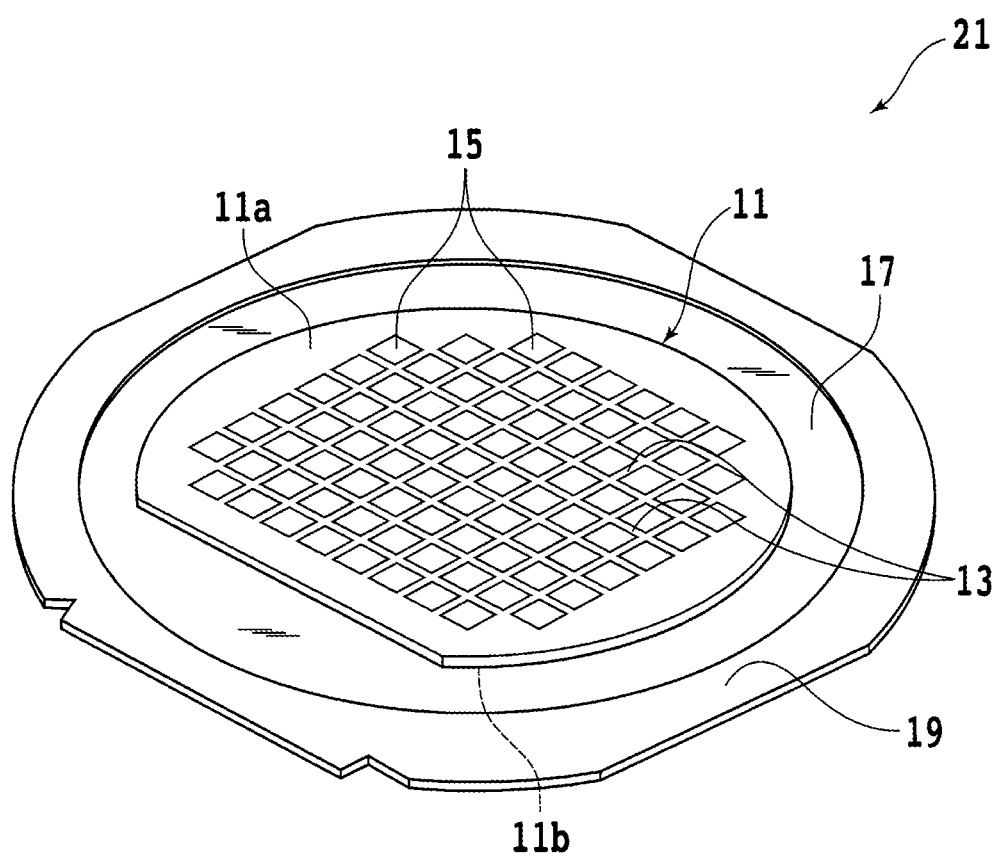
FIG. 3 is a perspective view of a wafer unit.
Figure 6:
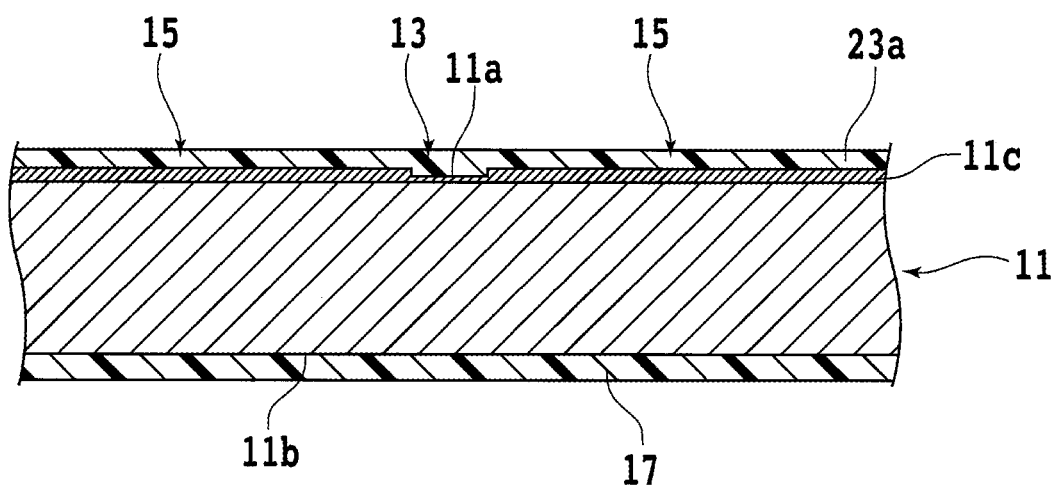
FIG. 6 is an enlarged fragmentary cross-sectional view of a wafer covered with a projective film.

The structure of a wafer unit 21 will be described below with reference to FIG. 3. FIG. 3 illustrates, in perspective, the wafer unit 21. As illustrated in FIG. 3, the wafer 11 has a face side 11a on which there is disposed a circuit layer 11c (see FIG. 6) including an interlayer insulating film material with a low dielectric constant, i.e., a low-k material, and a metallization layer. A plurality of straight projected dicing lines or streets 13 are established in a grid or intersecting pattern on the face side 11a of the wafer 11. Devices 15 such as ICs are formed in respective rectangular areas demarcated on the face side 11a of the wafer 11 by the projected dicing lines 13. As illustrated in FIG. 6, the rectangular areas where the devices 15 are present are slightly thicker than areas where the projected dicing lines 13 are established.

As illustrated in FIG. 3, a circular dicing tape 17 that is larger in diameter than the wafer 11 has a central portion affixed to a reverse side 11b of the wafer 11. The dicing tape 17 has a layered structure including a base layer and an adhesive or glue layer. For example, the base layer is made of a resin such as polyolefin, whereas the adhesive layer is made of an adhesive resin such as an uncured ultraviolet-curable resin. The dicing tape 17 has an outer circumferential portion to which there is affixed a surface of an annular frame 19 having a circular opening larger in diameter than the wafer 11. The wafer 11 is thus supported on the frame 19 by the dicing tape 17, jointly making up the wafer unit 21.

As illustrated in FIG. 2, the laser processing apparatus 2 has a push-pull arm 10 disposed behind the cassette table 8, i.e., spaced from the cassette table 8 in the other of the Y-axis directions. The push-pull arm 10 grips the frame 19 and delivers the wafer unit 21 out of the cassette 6 onto a pair of guide rails 12. The guide rails 12 are disposed one on each side of a track along which the push-pull arm 10 is movable and have a function to adjust a position of the wafer unit 21 in the X-axis directions. A first delivery unit 14 is disposed on the base 4 near the guide rails 12 for delivering the wafer unit 21 from and to the guide rails 12.

The first delivery unit 14 has an arm that is of a substantially L shape as viewed in plan. The arm supports on its distal end an attracting mechanism for attracting the frame 19 under suction. The arm has a proximal end coupled to a turning mechanism including an electric motor, not depicted, for turning the arm about a predetermined pivot axis. The first delivery unit 14 is disposed in the vicinity of a coating/cleaning unit 16 housed in the base 4. The first delivery unit 14 delivers the wafer unit 21 between the guide rails 12 and the coating/cleaning unit 16. The coating/cleaning unit 16 will be described in detail below with reference to FIG. 4.

Figure 4:
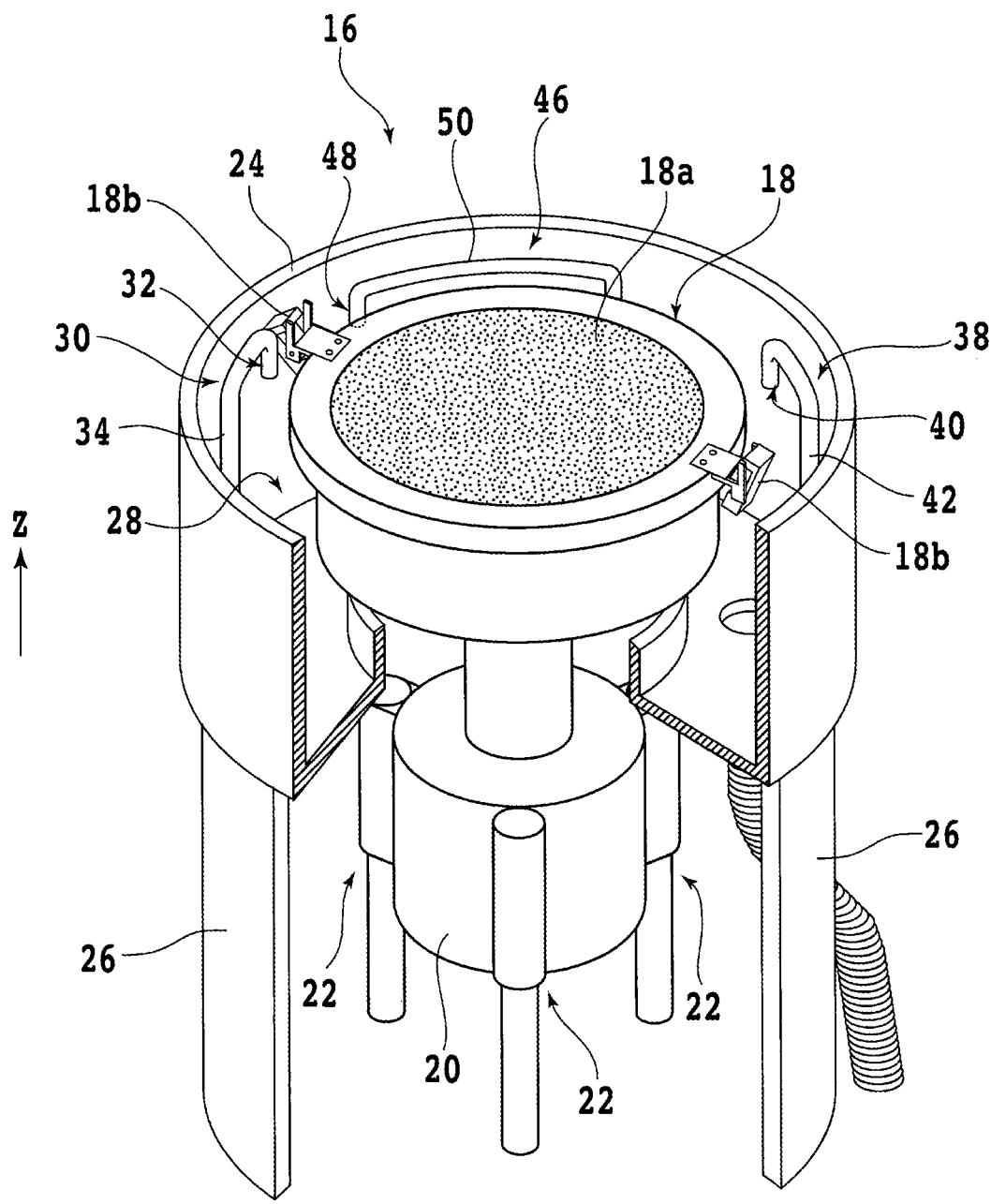
FIG. 4 is a perspective view of a coating/cleaning assembly.

FIG. 4 illustrates the coating/cleaning unit 16 in perspective. The coating/cleaning unit 16 produces a protective film 23a (see FIG. 6) on the face side 11a of the wafer 11 and then cleans the wafer 11 that has been processed by a laser beam with the face side 11a coated with the protective film 23a. As illustrated in FIG. 4, the coating/cleaning unit 16 has a spinner table 18 shaped as a circular plate. The spinner table 18 has a frame of metal that is shaped as a circular plate. The frame has a circular cavity, not depicted, defined in an upper surface thereof. A circular porous plate is fixedly disposed in the circular cavity. A negative pressure generated by a suction source, not depicted, such as an ejector is transmitted to the circular porous plate through a fluid channel, not depicted, defined in the frame.

The upper surface of the frame lies substantially flush with an upper surface of the circular porous plate, jointly making up a substantially flat holding surface 18a. A plurality of clamp units 18b (not illustrated in FIG. 2) are mounted on an outer circumferential portion of the spinner table 18. Each clamp unit 18b can swing like a pendulum according to centrifugal forces generated by the rotation of the spinner table 18. The spinner table 18 is coupled to a first actuator 20 such as an electric motor disposed below the spinner table 18 for rotating the spinner table 18 about a predetermined rotational axis parallel to the Z-axis. A plurality of air cylinders 22, each of which has a rod movable along the Z-axis, are mounted on a side surface of the first actuator 20.

Figure 5:
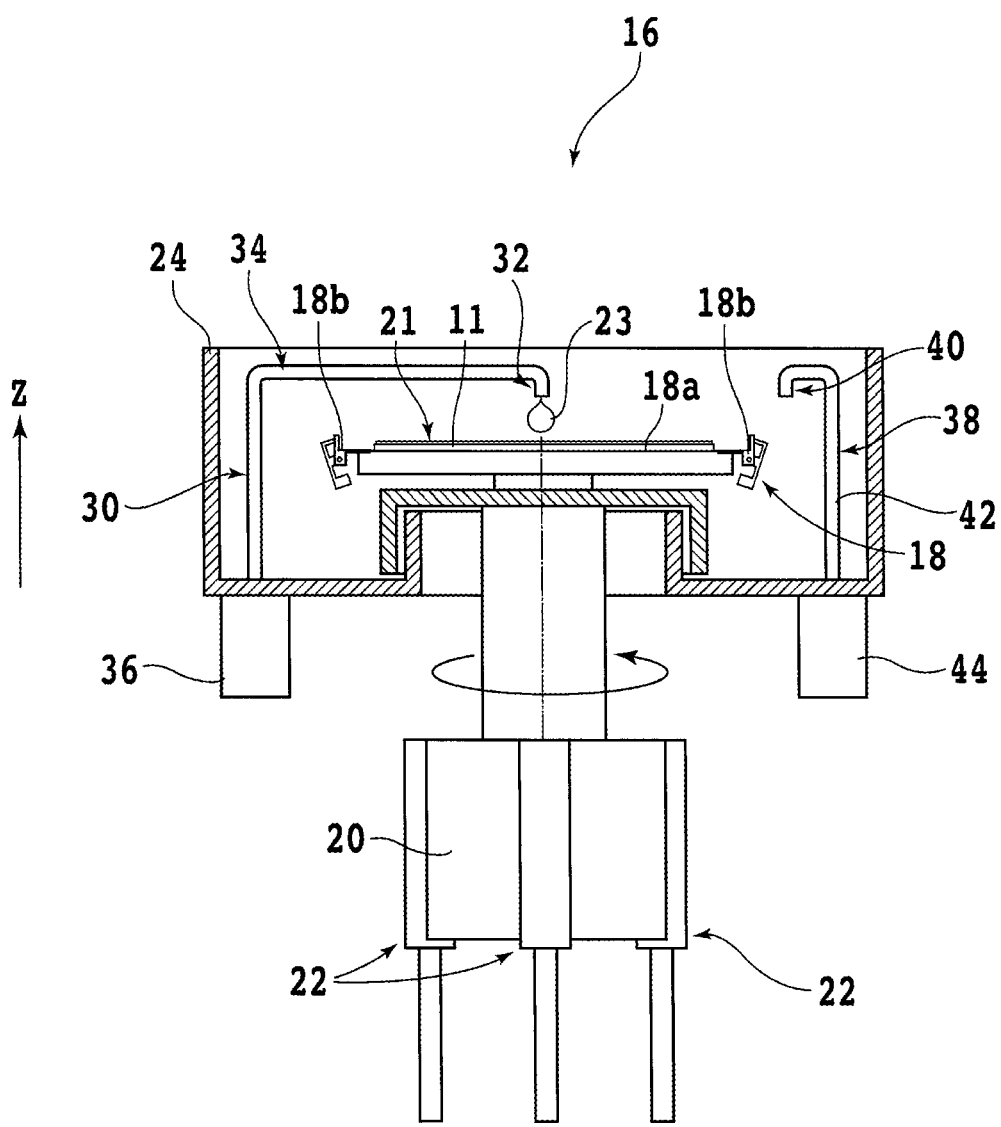
FIG. 5 is a side elevational view, partly in cross section, illustrating a protective film applying step.
Figure 8:
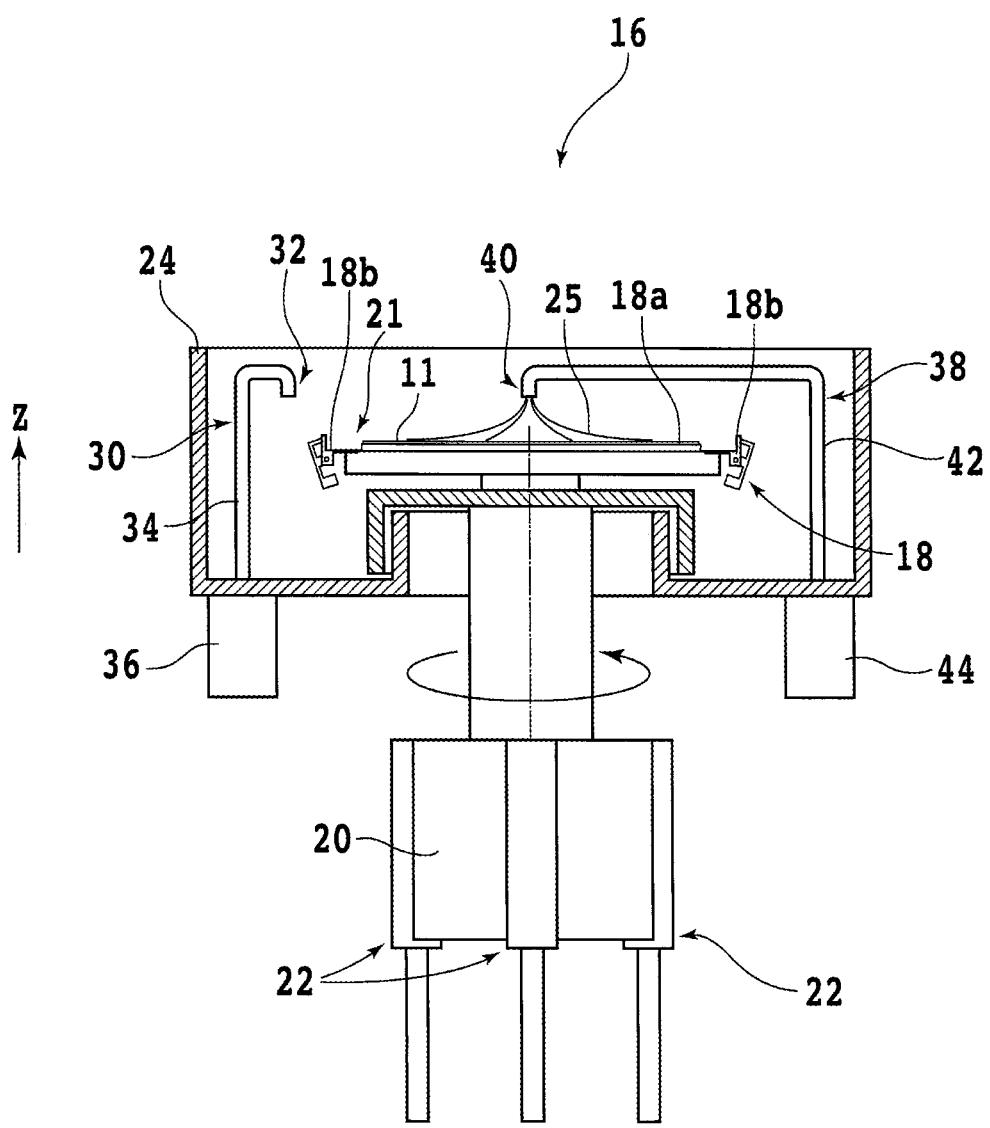
FIG. 8 is a side elevational view, partly in cross section, illustrating a protective film removing step.
Figure 10:
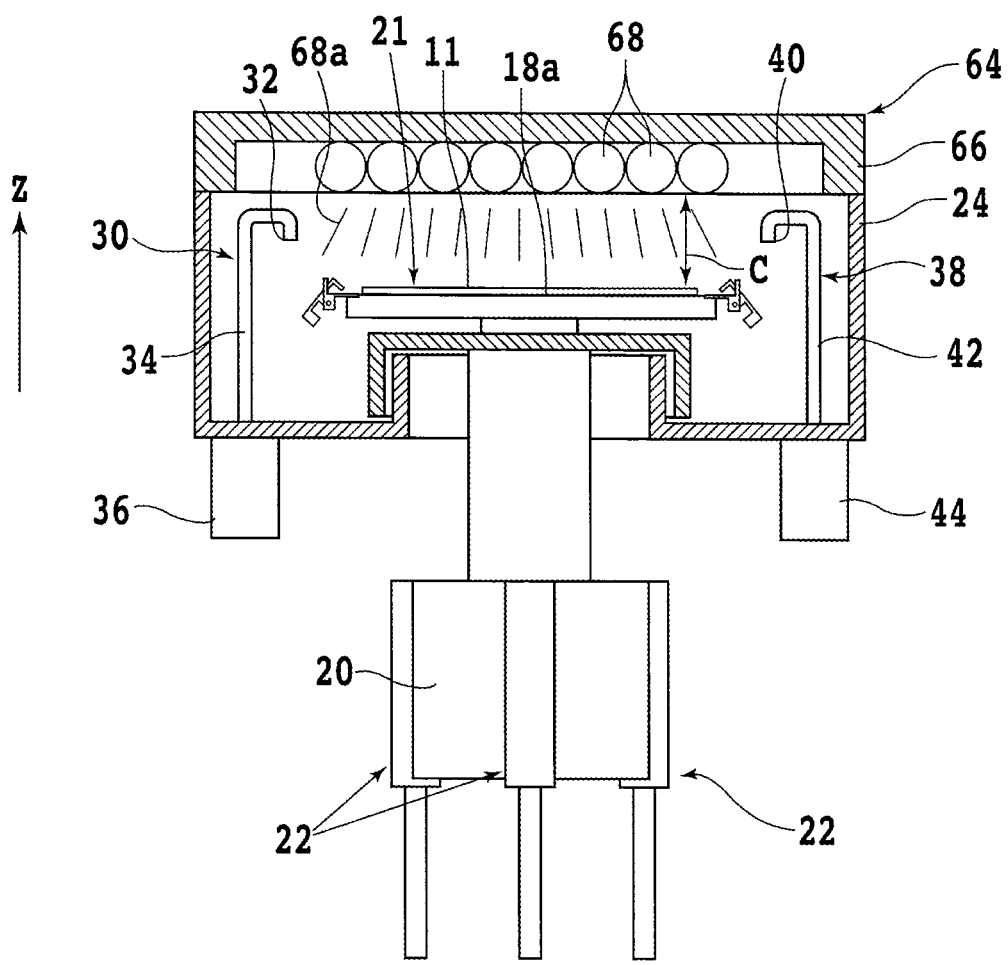
FIG. 10 is a side elevational view, partly in cross section, illustrating a residual organic substance removing step.

When the air cylinders 22 are actuated, the spinner table 18 and the first actuator 20 are moved along the Z-axis between a relatively high loading/unloading position (see FIG. 4) and a relatively low working position (see FIGS. 5, 8, and 10). The spinner table 18 has side and bottom walls surrounded by a hollow cylindrical bottomed receptacle 24 whose inside diameter is larger than the outside diameter of the spinner table 18. The receptacle 24 functions as a waste container. The receptacle 24 is supported on a plurality of legs 26. The receptacle 24 has a through opening defined centrally in its bottom wall. The first actuator 20 has an output shaft extending vertically through the through opening in the bottom wall of the receptacle 24. The through opening is covered with a hollow cylindrical cover (see FIG. 5).

The receptacle 24 is horizontally spaced from the spinner table 18 by an annular clearance 28 in which there is disposed a coating unit 30 for coating the wafer 11 with a liquid protective film agent 23 (see FIG. 5). The coating unit 30 has a first nozzle 32 for supplying the liquid protective film agent 23 to the face side 11a of the wafer 11 that is held under suction on the holding surface 18a. The first nozzle 32 is fixed to a distal end of a first arm 34. The first nozzle 32 and the first arm 34 are omitted from illustration in FIG. 2. The first nozzle 32 is fluidly connected to a liquid protective film agent supply source, not depicted, through a fluid channel, not depicted, defined in the first arm 34.

The liquid protective film agent supply source includes a tank, not depicted, storing the liquid protective film agent 23 therein and a pump, not depicted, for sending the liquid protective film agent 23 from the tank through the fluid channel in the first arm 34 to the first nozzle 32. The liquid protective film agent 23 includes a solvent of pure water, a water-soluble resin, a light absorbent, and an organic solution. The water-soluble resin includes polyvinylpyrrolidone, for example, though it may be any of other water-soluble resins, such as poly-N-vinylacetamide, polyoxazoline, or a copolymer of polymeric compounds, e.g., a vinyl acetate-vinylpyrrolidone copolymer, or a combination of a plurality of types of water-soluble resins.

The light absorbent includes a cinnamic acid derivative such as a ferulic acid or a caffeic acid or a benzophenone derivative such as polyhydroxy benzophenone or a 2-hydroxy-4-methoxy benzophonene-5-sulfonic acid, a flavone, flavonoid, or flavonol derivative such as transglycosylated rutin or transglycosylated hesperidin. The organic solution includes propylene glycol monomethyl ether (PGME), methanol, ethanol, isopropanol, acetone, or tetrahydrofuran.

The first arm 34 has a proximal end coupled to a reversible electric motor 36 (see FIG. 5). When the reversible electric motor 36 is energized, it turns the first arm 34 between a position (see FIG. 5) above a central area of the holding surface 18a where the first nozzle 32 applies the liquid protective film agent 23 to the wafer 11 on the holding surface 18a and a retracted position (see FIG. 4) where the first nozzle 32 is retracted from the position above the holding surface 18a.

In the annular clearance 28, there is also disposed a cleaning unit 38 at a position that is diametrically opposite the coating unit 30 across the spinner table 18. The cleaning unit 38 has a second nozzle 40 for supplying cleaning water 25 (see FIG. 8) such as pure water to the face side 11a of the wafer 11 held under suction on the holding surface 18a.

The second nozzle 40 is fixed to a distal end of a second arm 42. The second nozzle 40 and the second arm 42 are omitted from illustration in FIG. 2. The second nozzle 40 is fluidly connected to a cleaning water supply source, not depicted, through a fluid channel, not depicted, defined in the second arm 42. The cleaning water supply source includes a tank, not depicted, storing the cleaning water 25 therein and a pump, not depicted, for sending the cleaning water 25 from the tank through the fluid channel in the second arm 42 to the second nozzle 40. The second arm 42 has a proximal end coupled to a reversible electric motor 44 (see FIG. 5).

When the reversible electric motor 44 is energized, it turns the second arm 42 between a predetermined area (see FIG. 8) above the holding surface 18a and a retracted position (see FIG. 4) where the second nozzle 40 is retracted from the area above the holding surface 18a. In the predetermined area above the holding surface 18a, the second arm 42 is swung by the reversible electric motor 44, swinging the second nozzle 40 in a predetermined angular range while supplying the cleaning water 25 to the wafer 11 on the holding surface 18a.

An air ejection unit 46 is disposed in the clearance 28 between the coating unit 30 and the cleaning unit 38. The air ejection unit 46 has a third nozzle 48 for supplying air, not depicted, such as drying air to the face side 11a of the wafer 11 held under suction on the holding surface 18a. The third nozzle 48 is fixed to a distal end of a third arm 50. The third nozzle 48 and the third arm 50 are omitted from illustration in FIG. 2. The third nozzle 48 is fluidly connected to an air supply source, not depicted, through a fluid channel, not depicted, defined in the third arm 50.

The air supply source includes an air compressor, not depicted, and a tank, not depicted, storing air under pressure supplied from the air compressor. The third arm 50 has a proximal end coupled to a reversible electric motor, not depicted. When the reversible electric motor is energized, it turns the third arm 50 between a predetermined area, not depicted, above the holding surface 18a and a retracted position (see FIG. 4) where the third nozzle 48 is retracted from the area above the holding surface 18a. In the predetermined area above the holding surface 18a, the third arm 50 is swung in a predetermined angular range by the reversible electric motor, swinging the third nozzle 48 while supplying the air to the wafer 11 on the holding surface 18a.

As illustrated in FIG. 2, a rectangular opening 4a that is open upwardly is defined in the base 4 forwardly of the coating/cleaning unit 16. The rectangular opening 4a has a longitudinal axis extending along the X-axis. A chuck table 52 shaped as a circular plate is disposed in the rectangular opening 4a. The chuck table 52 has a frame of metal that is shaped as a circular plate. The frame has a circular cavity, not depicted, defined in an upper surface thereof. A circular porous plate is fixedly disposed in the circular cavity. A negative pressure generated by a suction source, not depicted, such as an ejector is transmitted to the circular porous plate through a fluid channel, not depicted, defined in the frame.

The upper surface of the frame lies substantially flush with an upper surface of the circular porous plate, jointly making up a substantially flat holding surface 52a for holding the wafer unit 21 under suction thereon. A plurality of clamp units 52b that are actuatable by respective air actuators, not depicted, are mounted on an outer circumferential portion of the chuck table 52. When actuated by the air actuators, the clamp units 52b grip the frame 19 of the wafer unit 21 held under suction on the holding surface 52a. The chuck table 52 is coupled to a second actuator, not depicted, such as an electric motor disposed below the chuck table 52 for rotating the chuck table 52 about a predetermined rotational axis parallel to the Z-axis.

The second actuator is supported on an X-axis movable plate, not depicted. The X-axis movable plate is slidably supported on a pair of guide rails, not depicted, extending along the X-axis. A nut, not depicted, is mounted on a lower surface of the X-axis movable plate. A screw shaft, not depicted, extending along the X-axis and disposed between the guide rails is rotatably threaded through the nut. The screw shaft has an end coupled to a third actuator, not depicted, such as a stepping motor for rotating the screw shaft about its central axis.

The X-axis movable plate, the guide rails, the nut, the screw shaft, and the third actuator jointly make up a ball-screw-type processing feed unit, not depicted, for moving the chuck table 52 and the second actuator along the X-axis. When the ball-screw-type processing feed unit is actuated, the chuck table 52 is moved between a loading/unloading area A1 near the cassette table 8 and a processing area A2. When the wafer 11 on the chuck table 52 is processed by a laser beam, the chuck table 52 is reciprocably moved in the processing area A2.

An image capturing unit 54 is disposed above a track along which the chuck table 52 is movable. The image capturing unit 54 has a camera including an objective lens and an image capturing device such as a charge-coupled-device (CCD) image sensor or a complementary-metal-oxide-semiconductor (CMOS) image sensor. The chuck table 52 is turned about the predetermined rotational axis parallel to the Z-axis to orient one of the projected dicing lines 13 substantially parallel to the X-axis on the basis of the result of an alignment process based on an image captured of the face side 11a of the wafer 11 by the image capturing unit 54.

The laser processing apparatus 2 includes a laser beam applying unit 56 disposed above the processing area A2 in the x-axis direction. The laser beam applying unit 56 has a hollow cylindrical casing 58 whose longitudinal axis extends horizontally along the Y-axis and a beam condenser 60 including a condensing lens, etc. The casing 58 houses therein a laser oscillator, not depicted, having a laser medium made of Nd:YAG, Nd:YVO$_4$, or the like. The laser oscillator includes a light source, not depicted, such as a laser diode for emitting stimulating light to the laser medium.

To the light source, there is electrically connected a pulse generator, not depicted, for controlling operation of the light source. The pulse generator controls laser beam pulse properties including a pulse duration, a repetitive frequency, etc. of a pulsed laser beam L (see FIG. 7) emitted from the laser oscillator. The casing 58 also houses therein a wavelength converter (not depicted) having a nonlinear optical crystal for generating harmonics.

The laser beam L that is emitted from the laser oscillator is converted by the wavelength convertor such that the laser beam L has a main peak at a predetermined wavelength, e.g., 355 nm, absorbable by the wafer 11. The laser beam L thus converted is emitted from the beam condenser 60 toward the holding surface 52a of the chuck table 52 positioned in the processing area A2. A ball-screw-type first Y-axis moving unit, not depicted, is coupled to the casing 58 for moving, i.e., indexing-feeding, the beam condenser 60 along the Y-axis.

The laser beam L applied from the beam condenser 60 to the wafer 11 on the holding surface 52a processes the wafer 11. After the wafer 11 has been processed by the laser beam L, the chuck table 52 is returned from the processing area A2 to the loading/unloading area A1 by the processing feed unit. A second delivery unit 62 for delivering the wafer unit 21 from the chuck table 52 in the loading/unloading area A1 to the coating/cleaning unit 16 is disposed behind the loading/unloading area A1. The second delivery unit 62 has an arm combined with a lifting and lowering mechanism such as an air cylinder on a distal end thereof. The lifting and lowering mechanism includes a suction mechanism on a lower end thereof for attracting the frame 19 under suction. The arm has a proximal end coupled to a ball-screw-type second Y-axis moving unit, not depicted, for moving the arm along the Y-axis.

An ultraviolet ray applying unit 64 is disposed below the arm of the second delivery unit 62. The ultraviolet ray applying unit 64 has a straight arm and a head 66 shaped as a circular plate connected to a distal end of the straight arm and having a diameter substantially equal to the outside diameter of the receptacle 24. The head 66 has a circular cavity defined therein that is exposed downwardly. The circular cavity houses therein an array of cylindrical ultraviolet lamps 68 (see FIG. 10). Each of the cylindrical ultraviolet lamps 68 includes a low-pressure mercury lamp, for example.

Ultraviolet (UV) rays 68a emitted from the ultraviolet lamps 68 include those having wavelengths of 185 nm and 254 nm. The ultraviolet rays 68a are applied from the head 66 to the holding surface 18a substantially in its entirety. The arm connected to the head 66 has a proximal end connected to a ball-screw-type third Y-axis moving unit, not depicted, for moving the arm and hence the head 66 along the Y-axis. The ball-screw-type third Y-axis moving unit moves the head 66 between an irradiating position B1 covering the coating/cleaning unit 16 and a retracted position B2 behind the irradiating position B1.

The wafer 11 is cleaned and dried by the coating/cleaning unit 16 and then irradiated with the ultraviolet rays 68a by the ultraviolet ray applying unit 64. Thereafter, the wafer 11 is delivered from the irradiating position B1 back to the cassette 6 by the first delivery unit 14, the guide rails 12, and the push-pull arm 10.

The laser processing apparatus 2 also has a control panel 70 for entering commands from the operator into the laser processing apparatus 2. The control panel 70 is mounted on a casing attached to a front side of the base 4. The control panel 70 functions as a pushbutton user interface.

The laser processing apparatus 2 further includes a display device 72 such as a liquid crystal display. The display device 72 displays processing conditions entered by the operator through the control panel 70, images acquired by the image capturing unit 54, and other information. The display device 72 may include a touch panel functioning as both a display device and an input device, providing the control panel 70 is dispensed with. The components described above of the laser processing apparatus 2 are controlled by a controller, not depicted.

The controller includes a computer including a processor, i.e., a processing unit, typically a central processing unit (CPU), a main storage device such as a dynamic random access memory (DRAM), and an auxiliary storage device such as a flash memory. The auxiliary storage device stores pieces of software including predetermined programs. The controller has its functions performed when the processor and other components thereof are operated according to the stored pieces of software.

The method of processing the wafer 11 using the laser processing apparatus 2 will be described below. First, the wafer unit 21 is delivered from the cassette 6 to the coating/cleaning unit 16 where the face side 11a of the wafer 11 is coated with the protective film 23a (protective film applying step S10). FIG. 5 illustrates the protective film applying step S10 in side elevation, partly in cross section. In FIG. 5, the air ejection unit 46 is omitted from illustration. Similarly, the air ejection unit 46 is omitted from illustration in FIGS. 8 and 10.

In the protective film applying step S10, the reverse side 11b of the wafer 11 is held under suction on the holding surface 18a with the dicing tape 17 interposed therebetween so that the face side 11a is exposed upwardly. Then, the spinner table 18 is rotated about its central axis at a predetermined speed ranging from 10 rpm to 100 rpm, for example. The first nozzle 32 is placed above the position above the central area of the holding surface 18a, and then applies the liquid protective film agent 23 to the face side 11a of the wafer 11. The liquid protective film agent 23 applied to the face side 11a is spread radially outwardly over the face side 11a in its entirety under centrifugal forces. Thereafter, the first nozzle 32 stops applying the liquid protective film agent 23 to the face side 11a, while the spinner table 18 continues to rotate to dry the applied protective film agent 23 into a protective film 23a having a substantially uniform thickness ranging from 0.5 μm to 10 μm, for example, on the face side 11a. FIG. 6 illustrates the wafer 11 covered with the protective film 23a in enlarged fragmentary cross section.

After the protective film applying step S10, the wafer unit 21 is delivered to the chuck table 52 in the loading/unloading area A1 and held under suction on the holding surface 52a thereof. The image capturing unit 54 captures an image of the face side 11a of the wafer 11, and the alignment process is carried out by performing pattern matching, etc. based on the captured image. On the basis of the result of the alignment process, the chuck table 52 is slightly turned to orient one of the projected dicing lines 13 substantially parallel to the X-axis. Thereafter, the chuck table 52 is moved from the loading/unloading area A1 to the processing area A2 where the chuck table 52 is positioned directly below the laser beam applying unit 56. The focused spot of the laser beam L emitted from the beam condenser 60 is positioned at one end of the projected dicing line 13 on the face side 11a, and the chuck table 52 is moved in one of the X-axis directions to apply the laser beam L to the face side 11a along the projected dicing line 13 (laser processing step S20).

Figure 7:
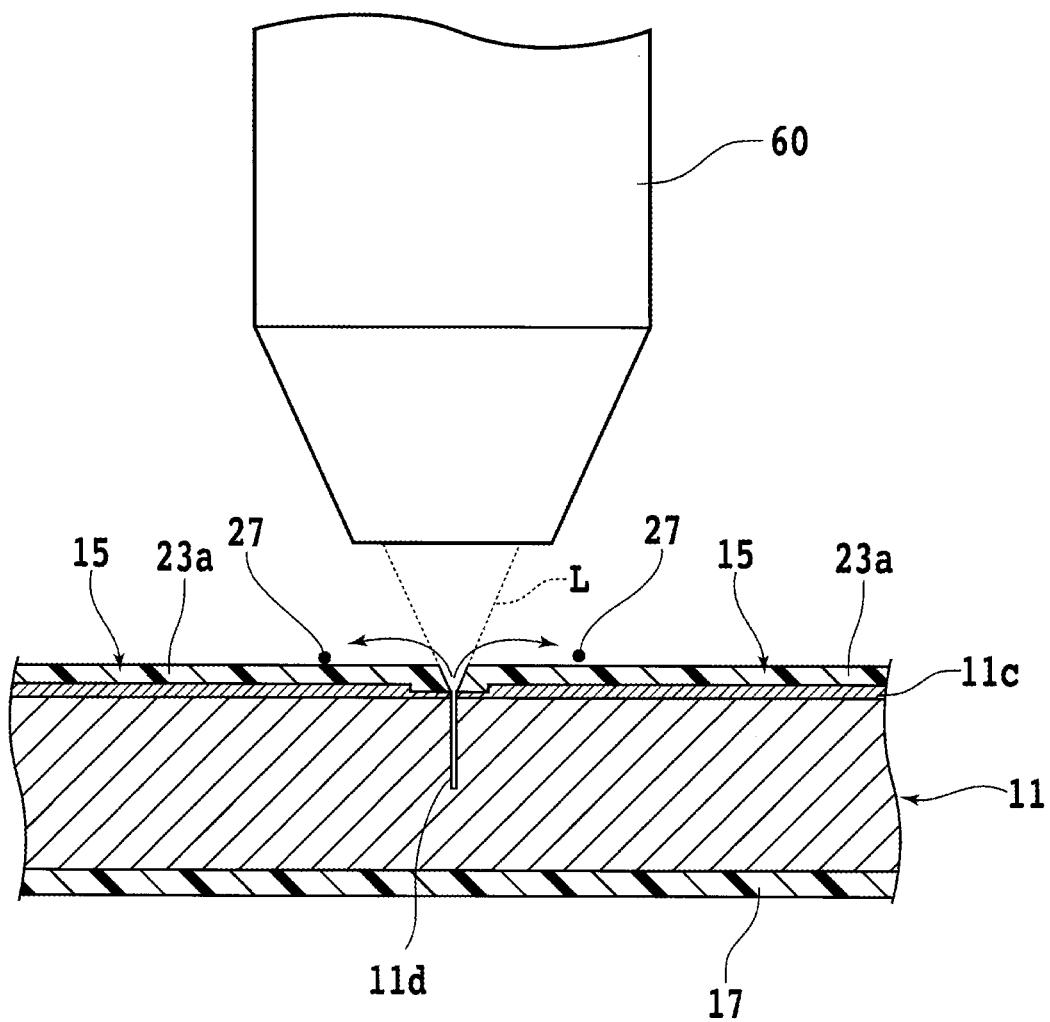
FIG. 7 is an enlarged fragmentary elevational view, partly in cross section, illustrating a laser processing step.

FIG. 7 illustrates the laser processing step S20 in enlarged fragmentary cross section. The laser beam L applied to the face side 11a performs an ablation process on the wafer 11, partly removing the protective film 23a and the circuit layer 11c along the projected dicing line 13 thereby to produce a laser-processed slot 11d in the semiconductor substrate to a predetermined thickness. The laser beam L is applied to process the wafer 11 under the following processing conditions, for example.

Laser medium: Nd:YAG
Wavelength: 355 nm
Average output power: 0.1 W to 100 W (typically, 0.5 W to 15 W)
Repetitive frequency: 20 kHz to 50000 kHz
Focused spot diameter: 1.0 μm to 100 μm (typically, 30 μm to 60 μm)
Pulse duration: 10 fs to 500 ns
Processing feed speed: 20 mm/s to 5000 mm/s (typically, 100 mm/s to 1000 mm/s)

After the laser beam L has been applied to the wafer 11 along the X-axis from one end to the other of a projected dicing line 13, the beam condenser 60 is indexing-fed a predetermined distance along the Y-axis. Then, the laser beam L is applied to the wafer 11 along the X-axis from one end to the other of a next projected dicing line 13 that is disposed adjacent to the previous projected dicing line 13 in one of the Y-axis directions. After the laser beam L has been applied to the wafer 11 along all the projected dicing lines 13 that extend along one direction, the chuck table 52 is turned 90 degrees. Then, the laser beam L is applied to the wafer 11 along all the projected dicing lines 13 that extend perpendicularly to the one direction. In this manner, laser-processed slots 11d are produced in the wafer 11 along all the projected dicing lines 13 on the face side 11a.

In the laser processing step S20, a melted substance produced from the wafer 11 by the applied laser beam L is scattered around as debris 27 and deposited on the upper surface of the protective film 23a. After the laser processing step S20, the wafer unit 21 is delivered to the coating/cleaning unit 16 where the protective film 23a is cleaned away with cleaning water 25 (see FIG. 8) (protective film removing step S30). FIG. 8 illustrates the protective film removing step S30 in side elevation, partly in cross section. In the protective film removing step S30, the holding surface 18a holds the reverse side 11b of the wafer 11 under suction thereon. Then, while the second nozzle 40 is being swung in the predetermined angular range, the second nozzle 40 ejects the cleaning water 25 to the face side 11a and the spinner table 18 is rotated at a predetermined speed of 300 rpm, for example.

The protective film 23a is dissolved by the cleaning water 25 and removed from the face side 11a under centrifugal forces. At this time, the debris 27 is also removed together with the protective film 23a from the face side 11a. After the wafer 11 has been cleaned for a predetermined period of time, the second nozzle 40 stops ejecting the cleaning water 25 to the wafer 11. Then, the spinner table 18 is rotated at a predetermined speed of 2000 rpm, for example, for a predetermined period of time, thereby drying the wafer 11.

Figure 9:
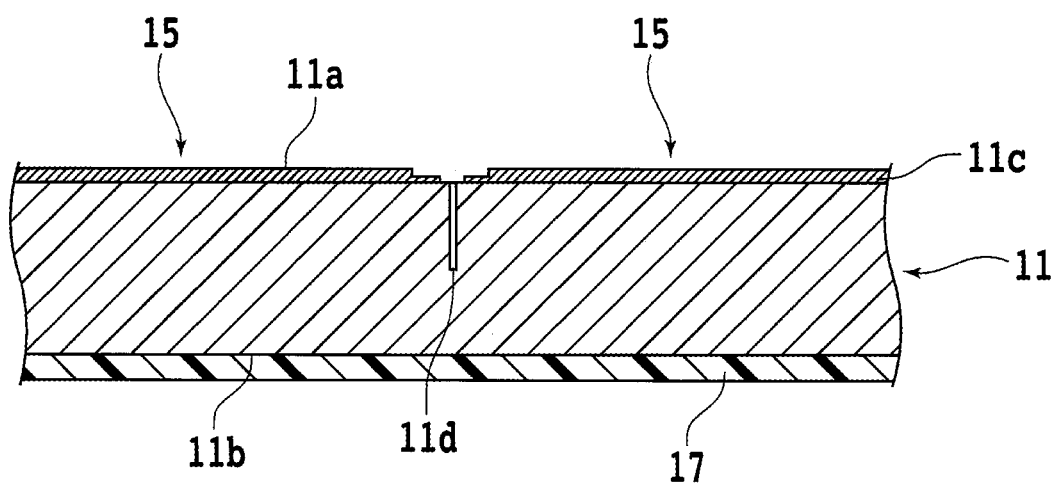
FIG. 9 is an enlarged fragmentary cross-sectional view of the wafer after the protective film removing step.

FIG. 9 illustrates the wafer 11 after the protective film removing step S30 in enlarged fragmentary cross section. The protective film 23a and the debris 27 are removed substantially entirely from the wafer 11 in the protective film removing step S30. However, a close examination conducted by the present applicant has revealed that a layer of organic substance deriving from the protective film 23a and having a thickness in the range from about several nm to several tens nm remains on the face side 11a of the wafer 11 after the protective film removing step S30.

Specifically, a layer made of compounds containing nitrogen atoms (N) and represented by molecular formulas $C_4H_8NO$, $C_5H_8NO$, $C_7H_{10}NO$, $C_8H_{12}NO$, etc. and having a thickness ranging from approximately several nm to several tens nm remains on the face side 11a of the wafer 11. The compounds containing nitrogen atoms are thought to derive from polyvinylpyrrolidone or the like referred to above that is used as the water-soluble resin. In addition, compounds represented by molecular formulas $C_2H_3O$, $C_4H_5O$, etc. as well as the compounds containing nitrogen atoms remain on the face side 11a of the wafer 11. The present applicant has found that when a layer of organic substance deriving from the protective film 23a and having a thickness ranging from approximately several nm to several tens nm remains on the face side 11a of the wafer 11, the face side 11a of the wafer 11 and an encapsulating resin 29 (see FIG. 11) are not held together in a sufficient level of intimate contact with each other, compared with when such a layer of organic substance does not remain on the face side 11a.

It is considered that when an organic substance containing nitrogen atoms remains on the face side 11a, the angle of contact of the encapsulating resin 29 with the face side 11a is smaller than when an organic substance containing nitrogen atoms does not remain on the face side 11a. However, the present applicant has found that regardless of the smaller angle of contact, the level of intimate contact of the encapsulating resin 29 with the face side 11a is lower than when an organic substance containing nitrogen atoms does not remain on the face side 11a due to some action between the organic substance containing nitrogen atoms and the encapsulating resin 29. According to the present embodiment, after the protective film removing step S30, the face side 11a of the wafer 11 is irradiated with ultraviolet rays 68a emitted from the ultraviolet lamps 68 (see FIG. 10) to remove the layer of organic substance deriving from the protective film 23a and remaining on the face side 11a (residual organic substance removing step S40).

FIG. 10 illustrates the residual organic substance removing step S40 in side elevation, partly in cross section. In the residual organic substance removing step S40, the head 66 of the ultraviolet ray applying unit 64 is placed in the irradiating position B1. Then, the face side 11a of the wafer 11 whose reverse side 11b has been held under suction on the spinner table 18 that is kept still is irradiated in its entirety with the ultraviolet rays 68a emitted from the ultraviolet lamps 68. For example, the ultraviolet rays 68a have an illuminance level of 50 ($W/m^2$) or higher and are applied to the face side 11a for an exposure time of 30 ($s$) or longer. According to the present embodiment, the illuminance level is set to a value ranging from 50 ($W/m^2$) to 70 ($W/m^2$), and the exposure time is set to 120 (s). The face side 11a of the wafer 11 is spaced from the ultraviolet lamps 68 by a distance of approximately 2 cm.

An example of mechanism for removing the residual organic substance from the face side 11a will be described below. When the ultraviolet rays 68a are applied to the face side 11a of the wafer 11 in a clean room atmosphere containing oxygen, those ultraviolet rays 68a which have the wavelength of 185 nm react with oxygen molecules ($O_2$), generating ozone ($O_3$). Furthermore, those ultraviolet rays 68a which have the wavelength of 254 nm react with the ozone, generating active oxygen. The generated active oxygen decomposes the organic substance made up of carbon (C), hydrogen (H), nitrogen (N), etc. into carbon dioxide ($CO_2$), carbon monoxide (CO), water ($H_2O$), nitrogen dioxide ($NO_2$), etc. The ultraviolet rays 68a which have the wavelength of 254 nm may react directly with the organic substance, decomposing it into a volatile substance, or may be involved in other reaction processes. At any rate, the application of the ultraviolet rays 68a is effective to reduce the organic substance deriving from the protective film 23a that remains on the face side 11a after the protective film removing step S30 and before the residual organic substance removing step S40 to about the same level as if the face side 11a were not covered with the protective film 23a.

After the residual organic substance removing step S40, the wafer unit 21 is taken out of the laser processing apparatus 2, and coverage regions 15a (see FIG. 11) corresponding to the face sides of the respective devices 15 are covered with the encapsulating resin 29 (encapsulating resin applying step S52). The face sides of the devices 15 are positioned at the face side 11a of the wafer 11. In the encapsulating resin applying step S52, a dispenser, not depicted, supplies the face side 11a with a liquid resin for encapsulation. The liquid resin for encapsulation includes, for example, a bisphenol-A-type epoxy resin, a bisphenol-F-type epoxy resin, a novolak-type epoxy resin, an aliphatic-type epoxy resin, a glycidylamine-type epoxy resin, or the like.

Figure 11:
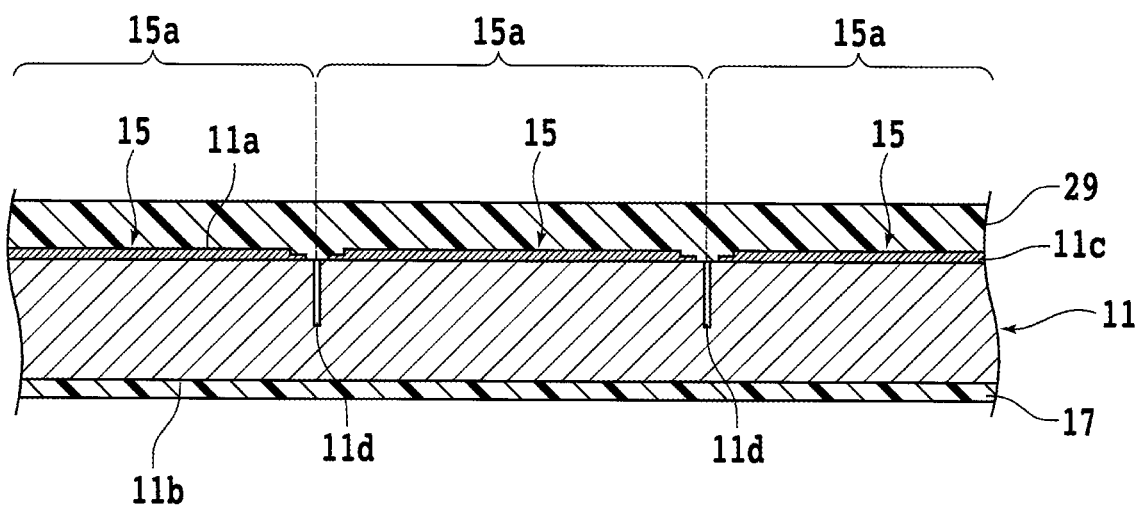
FIG. 11 is an enlarged fragmentary cross-sectional view of the wafer covered with an encapsulating resin.

After the liquid resin for encapsulation supplied to the face side 11a has been pressed against the face side 11a until the liquid resin is spread over the face side 11a in its entirety, a thermosetting process is performed to set the liquid resin, covering the face side 11a with the encapsulating resin 29. FIG. 11 illustrates the wafer 11 covered with the encapsulating resin 29 in enlarged fragmentary cross section. When the face side 11a is encapsulated all together by the encapsulating resin 29, the encapsulating resin 29 finds its way into the circuit layer 11c and the laser-processed slots 11d as well as the face sides of the devices 15. Therefore, the face sides of the devices 15 and the four sides thereof are encapsulated by the encapsulating resin 29.

Figure 12:
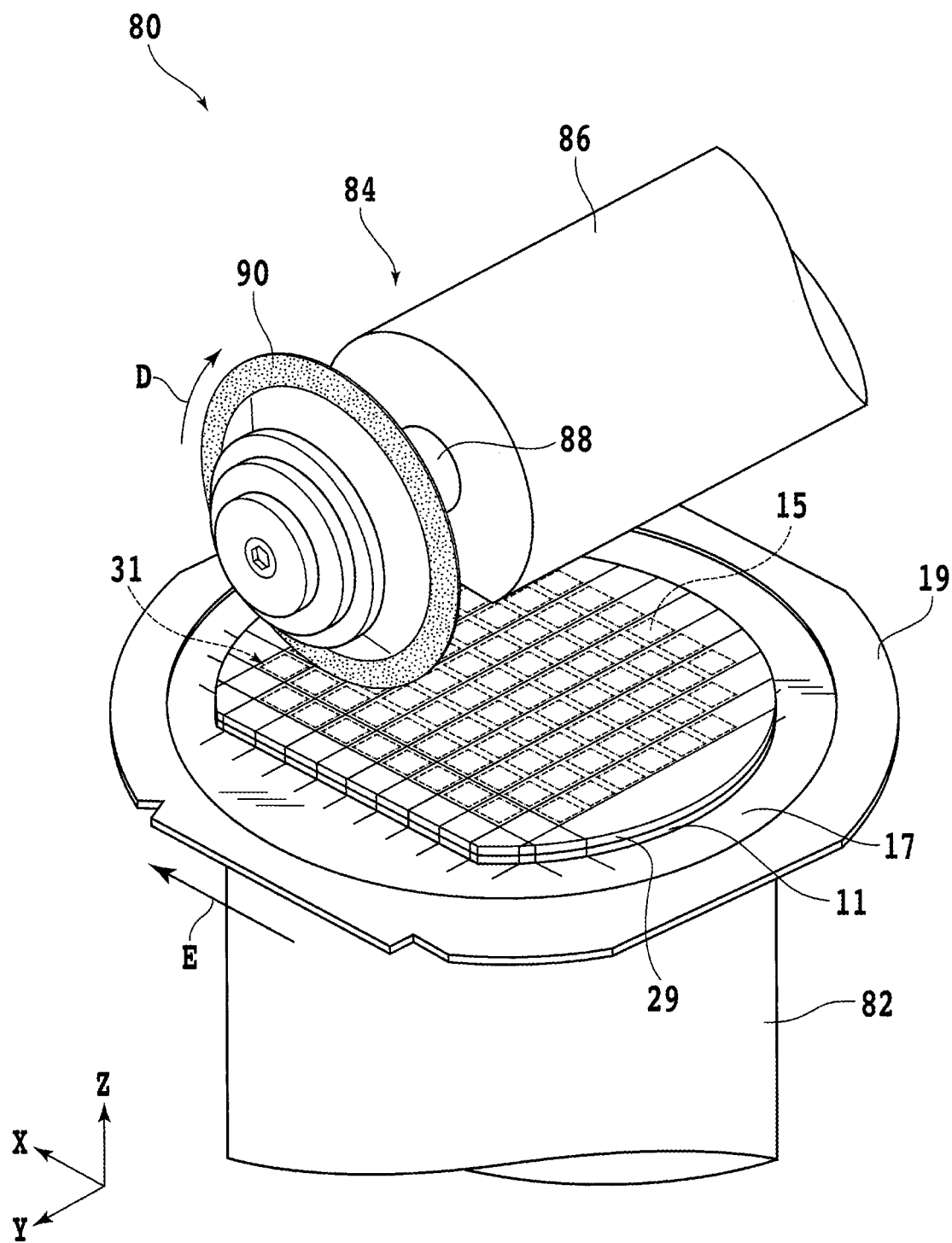
FIG. 12 is a perspective view illustrating a cutting step.

After the encapsulating resin applying step S52, the encapsulating resin 29 and the wafer 11 are cut along the projected dicing lines 13 by a cutting apparatus 80 (see FIG. 12) (cutting step S54). FIG. 12 illustrates the cutting step S54 in perspective. The cutting apparatus 80 has a chuck table 82 having a holding surface for holding the wafer unit 21 under suction thereon. The chuck table 82 is movable along the X-axis by a ball-screw-type X-axis moving unit, not depicted.

The cutting apparatus 80 also includes a cutting unit 84 disposed above the chuck table 82. The cutting unit 84 has a spindle housing 86 whose longitudinal axis extends along the Y-axis. A cylindrical spindle 88 has a portion rotatably housed in the spindle housing 86. The spindle 88 has a proximal end. A rotary actuator, not depicted, such as an electric motor is provided near the proximal end of the spindle 88. The spindle 88 has a distal end portion protruding from the spindle housing 86. A cutting blade 90 having an annular cutting edge is mounted on the protruding distal end portion of the spindle 88.

In the cutting step S54, an alignment process is carried out on the wafer 11 on the chuck table using an image capturing unit, not depicted, to orient one of the projected dicing lines 13 substantially parallel to the X-axis. Since terminals or the like, not depicted, that are in a predetermined positional relation to the projected dicing lines 13 are exposed on the upper surface of the encapsulating resin 29, the positions of the projected dicing lines 13 can be identified from an image captured of the upper surface of the encapsulating resin 29. Then, the cutting blade 90 is rotated about its central axis in a predetermined direction D, and the lower end of the rotating cutting blade 90 is positioned between the holding surface of the chuck table 82 and the dicing tape 17. While cutting water such as pure water is being supplied to the cutting blade 90, the chuck table 82 is processing-fed in a predetermined direction E so that the cutting blade 90 rotating in the direction D cuts the wafer 11 by way of down milling. In this fashion, the cutting blade 90 cuts the wafer 11 and the encapsulating resin 29 along the projected dicing lines 13 to divide the wafer 11 into a plurality of packaged devices 31.

According to the first embodiment, inasmuch as the organic substance deriving from the protective film 23a is removed in the residual organic substance removing step S40, the amount of organic substance remaining on the face side 11a is reduced to about the same level as if the face side 11a were not covered with the protective film 23a. Therefore, the level of intimate contact between the face side 11a and the encapsulating resin 29 becomes higher than if the residual organic substance removing step S40 were not carried out. As a result, both the prevention of the debris 27 from being deposited on the face side 11a and the increase in the level of intimate contact between the face side 11a and the encapsulating resin 29 are achieved.

Figure 13:
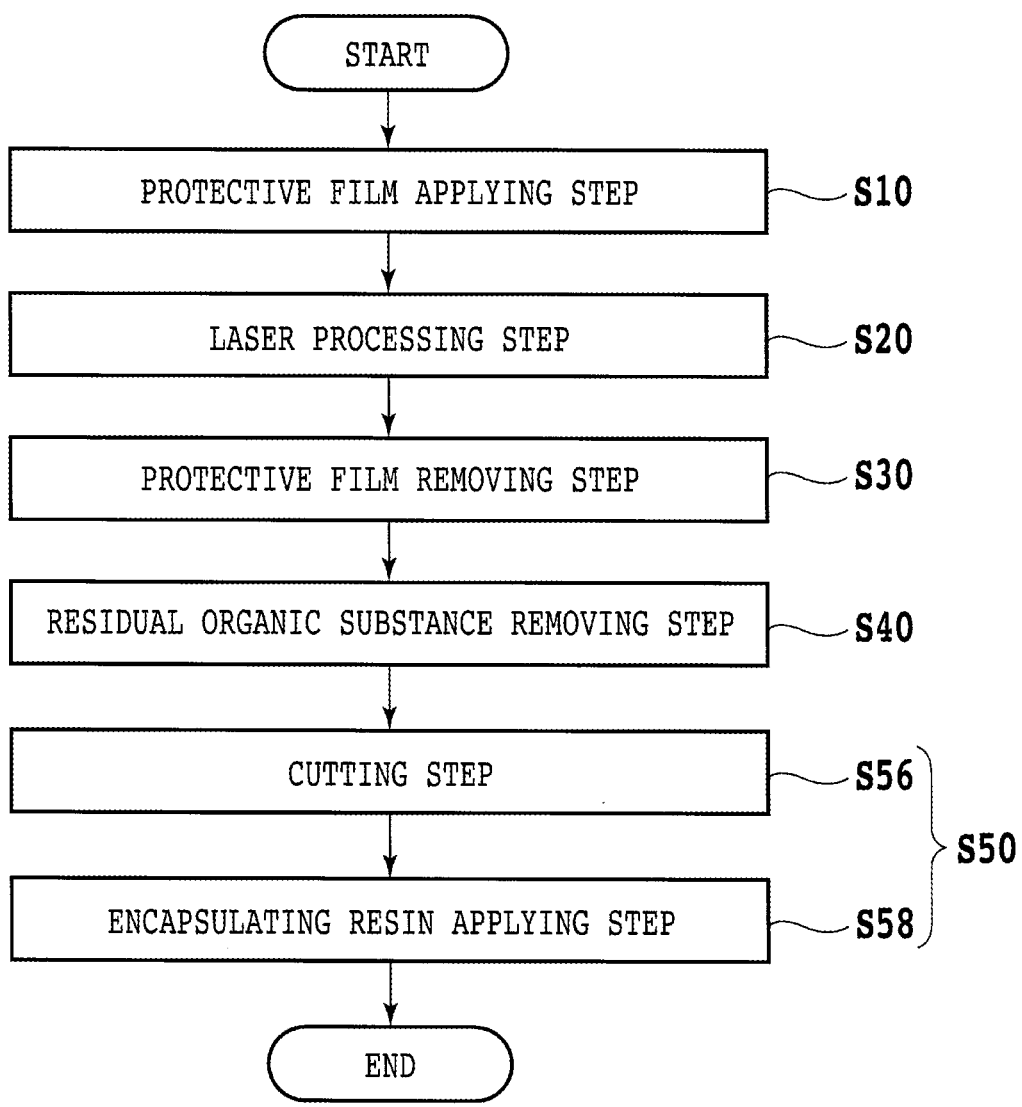
FIG. 13 is a flowchart of a sequence of a method of manufacturing a plurality of packaged devices according to a second embodiment of the present invention.
Figure 14A:
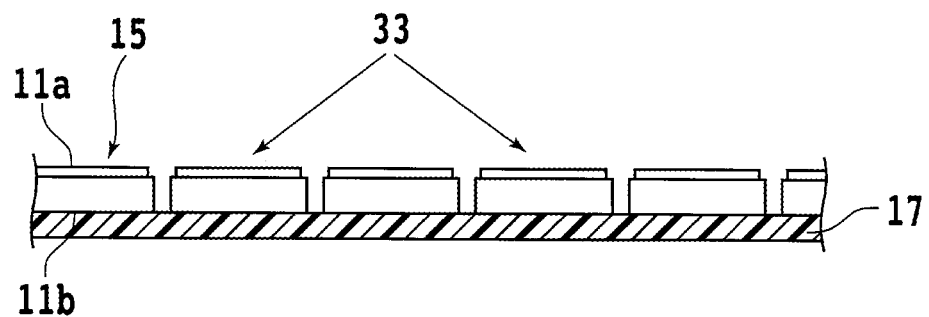
FIG. 14A is a side elevational view, partly in cross section, illustrating a plurality of device chips.

A second embodiment of the present invention will be described below. FIG. 13 illustrates a sequence of a method of manufacturing a plurality of packaged devices 39 (see FIG. 14B) according to the second embodiment. The method according to the second embodiment has the protective film applying step S10, the laser processing step S20, the protective film removing step S30, the residual organic substance removing step S40 that are identical to those of the method according to the first embodiment. Consequently, these steps will not be described below. According to the second embodiment, after the residual organic substance removing step S40, the cutting apparatus 80 cuts the wafer 11 into device chips 33 (see FIG. 14A) (cutting step S56). FIG. 14A illustrates the device chips 33 in side elevation, partly in cross section.

After the cutting step S56, the reverse side of a device chip 33 that is positioned at the reverse side 11b of the wafer 11 is placed on an upper surface of a wiring board 37, and the device 15 of the device chip 33 is electrically connected to the wiring board 37 by metal wires 35. Thereafter, a coverage region 15a, four sides of the device 15, the metal wires 35, the lower surface of the wiring board 37, etc. are encapsulated by the encapsulating resin 29 (encapsulating resin applying step S58). In this manner, a packaged device 39 is produced.

Figure 14B:
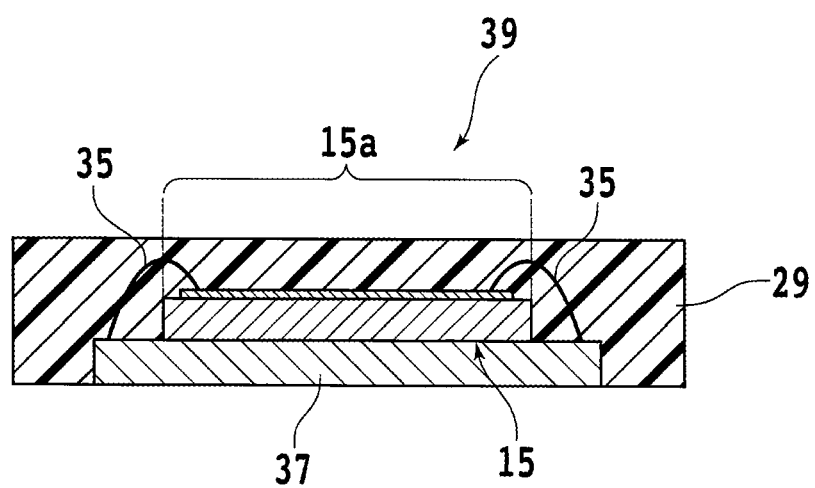
FIG. 14B is a cross-sectional view of a packaged device.

FIG. 14B illustrates the packaged device 39 in cross section. The other device chips 33 are similarly processed into respective packaged devices 39. According to the second embodiment, the cutting step S56 and the encapsulating resin applying step S58 are collectively referred to as the packaged device producing step S50. According to the second embodiment, inasmuch as the organic substance deriving from the protective film 23a is removed in the residual organic substance removing step S40, the amount of organic substance remaining on the face side 11a is reduced to about the same level as if the face side 11a were not covered with the protective film 23a. Therefore, the level of intimate contact between the face side 11a and the encapsulating resin 29 becomes higher than if the residual organic substance removing step S40 were not carried out. As a result, both the prevention of the debris 27 from being deposited on the face side 11a and the increase in the level of intimate contact between the face side 11a and the encapsulating resin 29 are achieved.

The structure, method, etc. according to the above embodiments may be changed or modified appropriately without departing from the scope of the present invention. For example, according to the second embodiment, the face sides of the device chips 33 and surfaces of the wiring boards 37 may be electrically connected by electrically conductive members such as solder balls, not depicted, rather than the metal wires 35. An encapsulating resin, also called an underfill, such as an epoxy resin, is interposed between each of the device chips 33 and a corresponding wiring board 37. Since the amount of organic substance remaining on the face side of the device chip 33 has been reduced in the residual organic substance removing step S40, the level of intimate contact between the device chip and the encapsulating resin is increased.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer having a plurality of devices provided in respective areas demarcated on a face side of the wafer by a plurality of intersecting projected dicing lines established on the face side, the method comprising:

a protective film applying step of coating the face side of the wafer with a protective film agent and thereafter drying the protective film agent into a protective film covering the face side of the wafer;

after the protective film applying step, a laser processing step of applying a laser beam having a wavelength absorbable by the wafer to the wafer along the projected dicing lines on the face side of the wafer, thereby producing a plurality of laser-processed slots in the wafer along the projected dicing lines;

after the laser processing step, a protective film removing step of cleaning away the protective film;

after the protective film removing step, a residual organic substance removing step of applying ultraviolet rays to the face side of the wafer to remove an organic substance deriving from the protective film and remaining on the face side of the wafer, wherein the organic substance remaining on the face side of the wafer after the protective film removing step and before the residual organic substance removing step includes compounds containing nitrogen atoms; and after the residual organic substance removing step, an encapsulating resin applying step of covering coverage areas corresponding to the respective devices on the face side of the wafer with an encapsulating resin.

2. A method of manufacturing a plurality of packaged devices from a wafer having a plurality of devices provided in respective areas demarcated on a face side of the wafer by a plurality of intersecting projected dicing lines established on the face side, the method comprising:

a protective film applying step of coating the face side of the wafer with a protective film agent and thereafter drying the protective film agent into a protective film covering the face side of the wafer;

after the protective film applying step, a laser processing step of applying a laser beam having a wavelength absorbable by the wafer to the wafer along the projected dicing lines on the face side of the wafer, thereby producing a plurality of laser-processed slots in the wafer along the projected dicing lines;

after the laser processing step, a protective film removing step of cleaning away the protective film;

after the protective film removing step, a residual organic substance removing step of applying ultraviolet rays to the face side of the wafer to remove an organic substance deriving from the protective film and remaining on the face side of the wafer, wherein the organic substance remaining on the face side of the wafer after the protective film removing step and before the residual organic substance removing step includes compounds containing nitrogen atoms; and after the residual organic substance removing step, a packaged device producing step of producing a plurality of packaged devices in which coverage areas corresponding to the respective devices on the face side of the wafer are covered with an encapsulating resin.

3. The method of processing a wafer according to claim 1, wherein the ultraviolet rays applied to the face side of the wafer have wavelengths of 185 nm and 254 nm.

4. The method of processing a wafer according to claim 2, wherein the ultraviolet rays applied to the face side of the wafer have wavelengths of 185 nm and 254 nm.

5. The method of processing a wafer according to claim 1, wherein the ultraviolet rays are applied by an ultraviolet ray applying unit which has a head shaped as a circular plate with a diameter equal to an outside diameter of a receptacle in which the wafer is held, such that the head includes a circular cavity which houses an array of cylindrical ultraviolet lamps.

6. The method of processing a wafer according to claim 2, wherein the ultraviolet rays are applied by an ultraviolet ray applying unit which has a head shaped as a circular plate with a diameter equal to an outside diameter of a receptacle in which the wafer is held, such that the head includes a circular cavity which houses an array of cylindrical ultraviolet lamps.

* * * * *